(12) United States Patent
Chang et al.

(10) Patent No.: US 10,312,421 B2
(45) Date of Patent: Jun. 4, 2019

(54) WHITE LIGHT SOURCE DEVICE

(71) Applicant: Lextar Electronics Corporation, Hsinchu (TW)

(72) Inventors: Cheng-Ping Chang, Hsinchu (TW); Zong-Han Yu, Taoyuan (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/696,198

(22) Filed: Sep. 6, 2017

(65) Prior Publication Data
US 2018/0108817 A1    Apr. 19, 2018

(30) Foreign Application Priority Data

Oct. 19, 2016    (TW) .............................. 105133757 A

(51) Int. Cl.
| | |
|---|---|
| *H01L 33/50* | (2010.01) |
| *H01L 25/13* | (2006.01) |
| *H01L 33/48* | (2010.01) |
| H01L 25/075 | (2006.01) |
| H01L 33/54 | (2010.01) |
| H01L 33/62 | (2010.01) |
| F21Y 115/10 | (2016.01) |

(52) U.S. Cl.
CPC ............ *H01L 33/507* (2013.01); *H01L 25/13* (2013.01); *F21Y 2115/10* (2016.08); *H01L 25/0753* (2013.01); *H01L 33/486* (2013.01); *H01L 33/504* (2013.01); *H01L 33/54* (2013.01); *H01L 33/62* (2013.01); *H01L 2224/48091* (2013.01)

(58) Field of Classification Search
CPC ..... H01L 33/507; H01L 33/486; H01L 25/13; H01L 33/504; H01L 2224/48091; H01L 33/54; H01L 33/62; H01L 25/0753

USPC ....................... 257/89; 362/84, 293; 313/498
See application file for complete search history.

(56) References Cited

U.S. PATENT DOCUMENTS

| | | | |
|---|---|---|---|
| 8,998,444 B2 | 4/2015 | Roberts et al. | |
| 9,052,067 B2 | 6/2015 | Van de Ven et al. | |
| 2009/0262515 A1* | 10/2009 | Lee | H01L 25/0753 |
| | | | 362/84 |
| 2009/0303694 A1* | 12/2009 | Roth | C09K 11/7734 |
| | | | 362/84 |
| 2011/0103038 A1* | 5/2011 | Song | F21K 9/00 |
| | | | 362/84 |

FOREIGN PATENT DOCUMENTS

| | | |
|---|---|---|
| TW | 201107917 A1 | 3/2011 |
| TW | 201115788 A1 | 5/2011 |
| TW | 201620162 A | 6/2016 |

* cited by examiner

*Primary Examiner* — Caleen O Sullivan
(74) *Attorney, Agent, or Firm* — CKC & Partners Co., LLC

(57) ABSTRACT

A white light source device includes a first light-emitting element, and at least one second light-emitting element. The first light-emitting element includes a first light-emitting unit and a first wavelength conversion unit, and emits a first light beam. Each of the second light-emitting elements includes a second light-emitting unit and a second wavelength conversion unit, and emits a second light beam. An emission spectrum of the second light beam is different from an emission spectrum of the first light beam. The first light beam and the second light beam are mixed into a white light beam, and a color fidelity index of the white light beam is greater than 90.

21 Claims, 12 Drawing Sheets
(3 of 12 Drawing Sheet(s) Filed in Color)

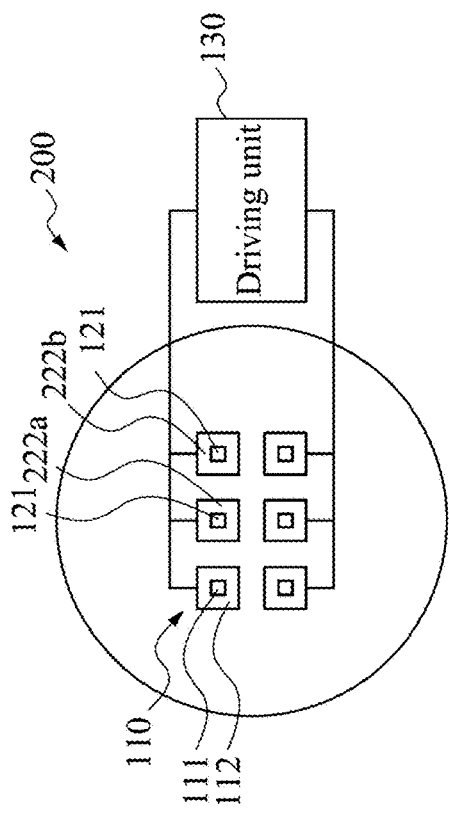
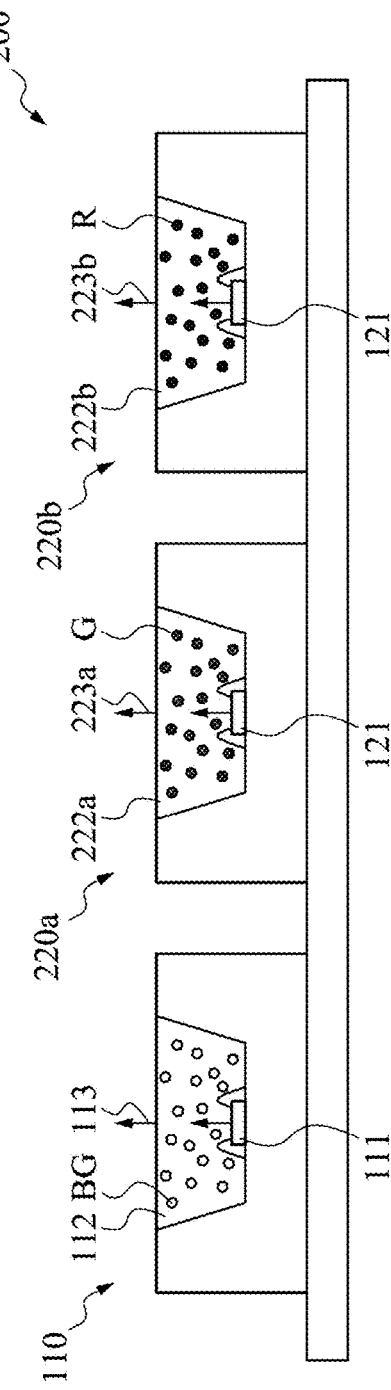
Fig. 3A
Fig. 3B

WHITE LIGHT SOURCE DEVICE

RELATED APPLICATIONS

This application claims priority to Taiwan Application Serial Number 105133757, filed Oct. 19, 2016, which is herein incorporated by reference.

BACKGROUND

Technical Field

The present disclosure relates to light source devices. More particularly, the present disclosure relates to a device having a white light source.

Description of Related Art

Recently, white Light-Emitting Diodes (LED) have gradually replaced traditional lighting equipment, the advantages of white LEDs are small size, low power consumption, long life, low heat, and good response speed, therefore, many of the problems of incandescent lamps can be overcome.

With applications of white LEDs getting more and more widely, different applications have different requirements for color temperature or Color Rendering Index (CRI) of white LEDS. For example, in the case of exhibition lighting or greenhouse lighting, it may be preferred that light emitted by white LEDs are close to natural light (sunlight). Therefore, how to provide a white LED having light close to natural light without additional circuit design, has become an important issue.

SUMMARY

An aspect of the disclosure is to provide a white light source device. The white light source device includes a first light-emitting element and at least a second light-emitting element. The first light-emitting element includes a first light-emitting unit and a first wavelength conversion unit, and the first light-emitting element emits a first light beam. Each of the second light-emitting elements includes a second light-emitting unit and at least a second wavelength conversion unit, and each of the second light-emitting elements emits a second light beam. An emission spectrum of the second light beam is different from an emission spectrum of the first light beam. The first light beam includes a first emission-wavelength peak and a second emission-wavelength peak, a wavelength range of the first emission-wavelength peak is between 450 nm and 462.5 nm, and a wavelength range of the second emission-wavelength peak is between 462.5 nm and 500 nm. And the first light beam and the second light beam are mixed into a white light beam.

Another aspect of the present disclosure provides a white light source device. The white light source device includes a first light-emitting element and at least a second light-emitting element. The first light-emitting element includes a first light-emitting unit and a first wavelength conversion unit, and the first light-emitting element emits a first light beam. Each of the second light-emitting elements includes a second light-emitting unit and at least a second wavelength conversion unit, and each of the second light-emitting elements emits a second light beam. An emission spectrum of the second light beam is different from an emission spectrum of the first light beam. The first light beam and the second light beam are mixed into a white light beam, and a color fidelity index (Rf) of the white light beam is greater than 90.

A further another aspect of the present disclosure provides a white light source device. The white light source device includes a first light-emitting element and at least a second light-emitting element. The first light-emitting element includes a first light-emitting unit and a first wavelength conversion unit, and the first light-emitting element emits a first light beam. Each of the second light-emitting elements includes a second light-emitting unit and at least a second wavelength conversion unit, and each of the second light-emitting elements emits a second light beam. An emission spectrum of the second light beam is different from an emission spectrum of the first light beam. The first light beam and the second light beam are mixed into a white light beam, and the CRIs of the Color Evaluation Sample (CES) 64-CES78 of the white light beam are greater than 90.

In one embodiment of the present disclosure, the aforementioned first wavelength conversion unit includes a single type of phosphors.

In one embodiment of the present disclosure, the aforementioned first wavelength conversion unit includes blue-green phosphors.

In one embodiment of the present disclosure, the aforementioned second wavelength conversion unit includes two types of phosphors.

In one embodiment of the present disclosure, the aforementioned second wavelength conversion unit includes red phosphors and green phosphors.

In one embodiment of the present disclosure, an amount of the aforementioned at least one second light-emitting elements is more than one, wherein part of the second wavelength conversion units includes green phosphors and another part of the second wavelength conversion units includes red phosphors.

BRIEF DESCRIPTION OF THE DRAWINGS

The patent or application file contains at least one drawing executed in color. Copies of this patent or patent application publication with color drawings will be provided by Office upon request and payment of the necessary fee. The disclosure can be more fully understood by reading the following detailed description of the embodiment, with reference made to the accompanying drawings as follows.

FIG. 3A is a diagram illustrating a white light source device according to another embodiment of the present disclosure.

FIG. 3B is a cross-sectional view of the white light source device in FIG. 3A.

DETAILED DESCRIPTION

Reference will now be made in detail to the present embodiments of the disclosure, examples of which are illustrated in the accompanying drawings. This disclosure may, however, be embodied in many different forms and should not be construed as limited to the embodiments set forth herein.

Figure 1A:
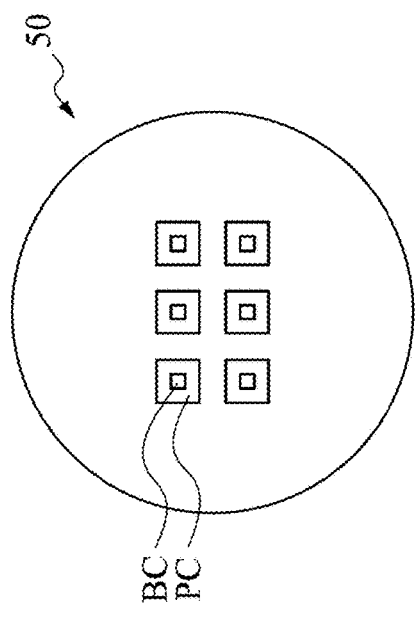
FIG. 1A is a diagram illustrating a comparative embodiment of a white light source device.
Figure 1B:
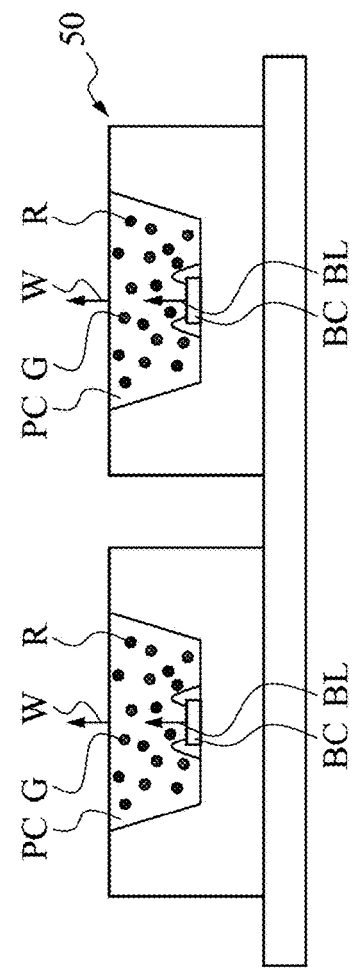
FIG. 1B is a cross-sectional view of the white light source device of FIG. 1A.

FIG. 1A is a diagram illustrating a comparative embodiment of a white light source device. FIG. 1B is a cross-sectional view of the white light source device of FIG. 1A. Please refer to FIG. 1B and FIG. 1A; the white light source device 50 of the comparative embodiment includes a plurality of blue LEDs BC and wavelength conversion units PC. In this comparative embodiment, the wavelength conversion units PC include both red phosphors R and green phosphors G, wherein the wavelength conversion units PC are luminophors formed by, for example, sintering, coating or depositing.

Specifically, as shown in FIG. 1B, in this comparative embodiment, the blue LEDs BC provide a radiating light beam BL, a portion of the radiating light beam BL will be absorbed by the wavelength conversion units PC and is converted into red light and green light, and then are mixed with another portion of blue light to form a white light. However, generally, under a high driving current, the white light source device 50 formed in this way will have an intensity of the blue light spectrum which increases quicker than the intensities of other light spectrums, and, since the peak value of the blue light emission spectrum is decided by the intensity of the driving current, the conversion rate of the phosphor powders therefore is very important, or it will light in a cold white light manner(i.e., the optical spectrum around red light is obviously insufficient). In this way, it can not achieve a good CRI performance, and fails to meet the requirements for full color applications. For example, the CRI of the white light source device 50 is generally around 80, comparing to incandescent lamp which is regarded as an ideal reference light source (the CRI of which is defined as 100), the white light source device 50 cannot meet the high quality requirements for indoor lighting.

Figure 1C:
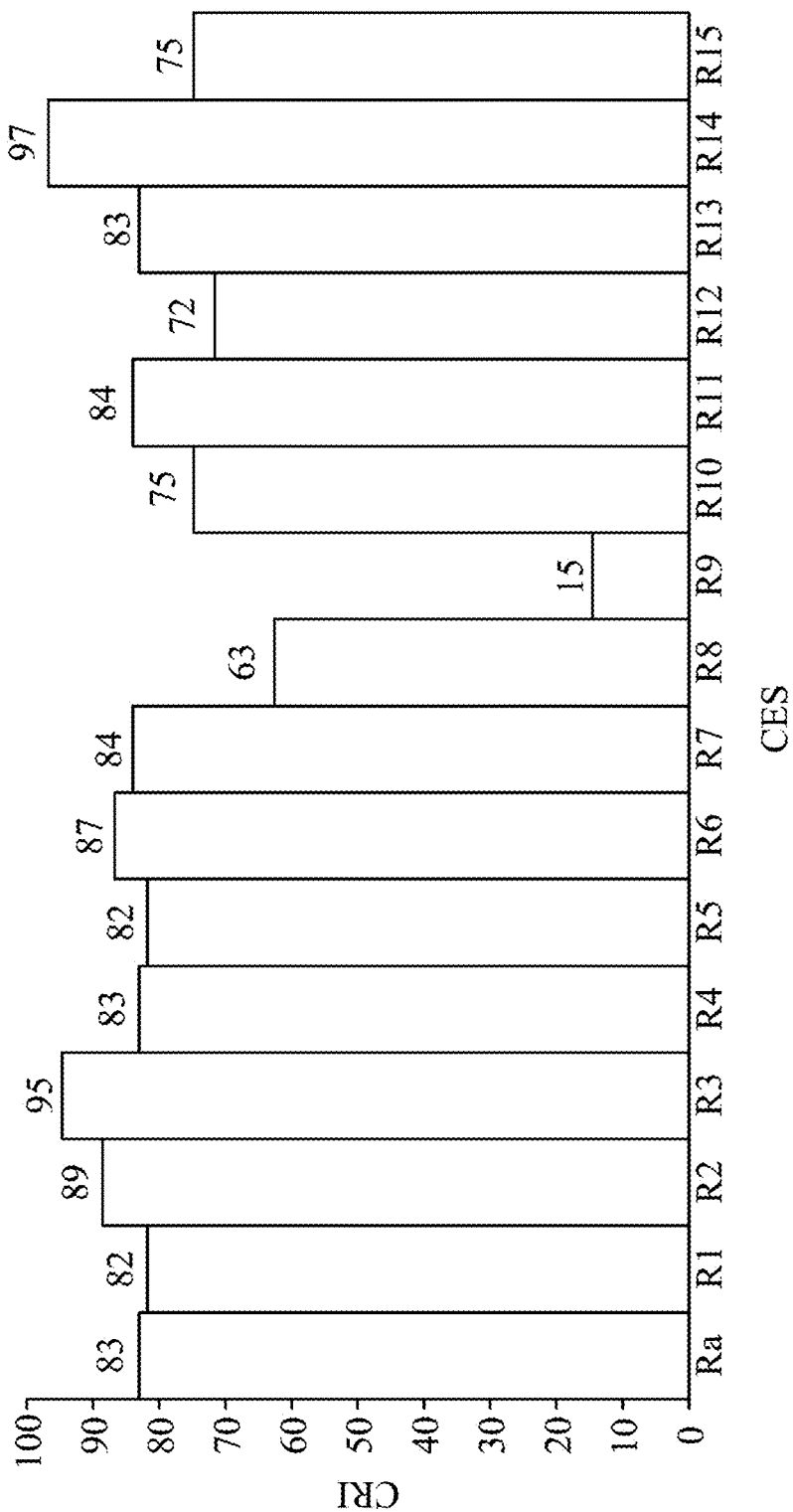
FIG. 1C is a bar chart of the CRIs of the colors of the white light source device in FIG. 1A.

FIG. 1C is a bar chart of the CRIs of the colors of the white light source device in FIG. 1A. More particularly, CRI is an important indicator of the ability that an artificial light can restore the object color, specifically, it is the level the artificial light restores the color of the object, in comparison against the ideal reference light source. Generally, CRIs have 15 color, includes: light greyish red (R1), dark greyish yellow (R2), strong yellow green (R3), moderate yellow green (R4), light bluish green (R5), light blue (R6), light violet (R7), light reddish purple (R8), strong red (R9), strong yellow (R10), strong green (R11), strong blue (R12), light yellowish pink (R13), moderate olive green (R14), Asian skin color (R15). General color rendering index (Ra) is the average value of CRIs of the first eight colors, and the value is the CRI performance of the light source.

Specifically, as shown in FIG. 1C; the general color rendering index (Ra) of the white light source device 50 in this comparative embodiment is about 83, and the CRI of the strong red (R9) is only 15, it means the band around the red light in the emission spectrum of the white light source device 50 is obviously insufficient. Hence, it cannot achieve good CRI performance, and fails to meet the full color applications and thus is not suitable for indoor lighting.

On the other hand, when increasing the CRIs of the white light source device 50 by increasing the phosphor powders in the white light source device 50, since the lights of the red phosphors R and of the green phosphors G will absorb each other, the luminance of the white light source device 50 will be decreased. For instance, if the general color rendering index (Ra) of the white light source device 50 is promoted to 90, then the luminance will be decreased 20%; if the general color rendering index (Ra) of the white light source device 50 is further promoted to 95, the luminance will be decreased 25%, the resulted luminous efficiency is poor. Therefore, the white light source device 50 cannot keep both the good performance of CRIs and the luminance requirements.

Figure 1D:
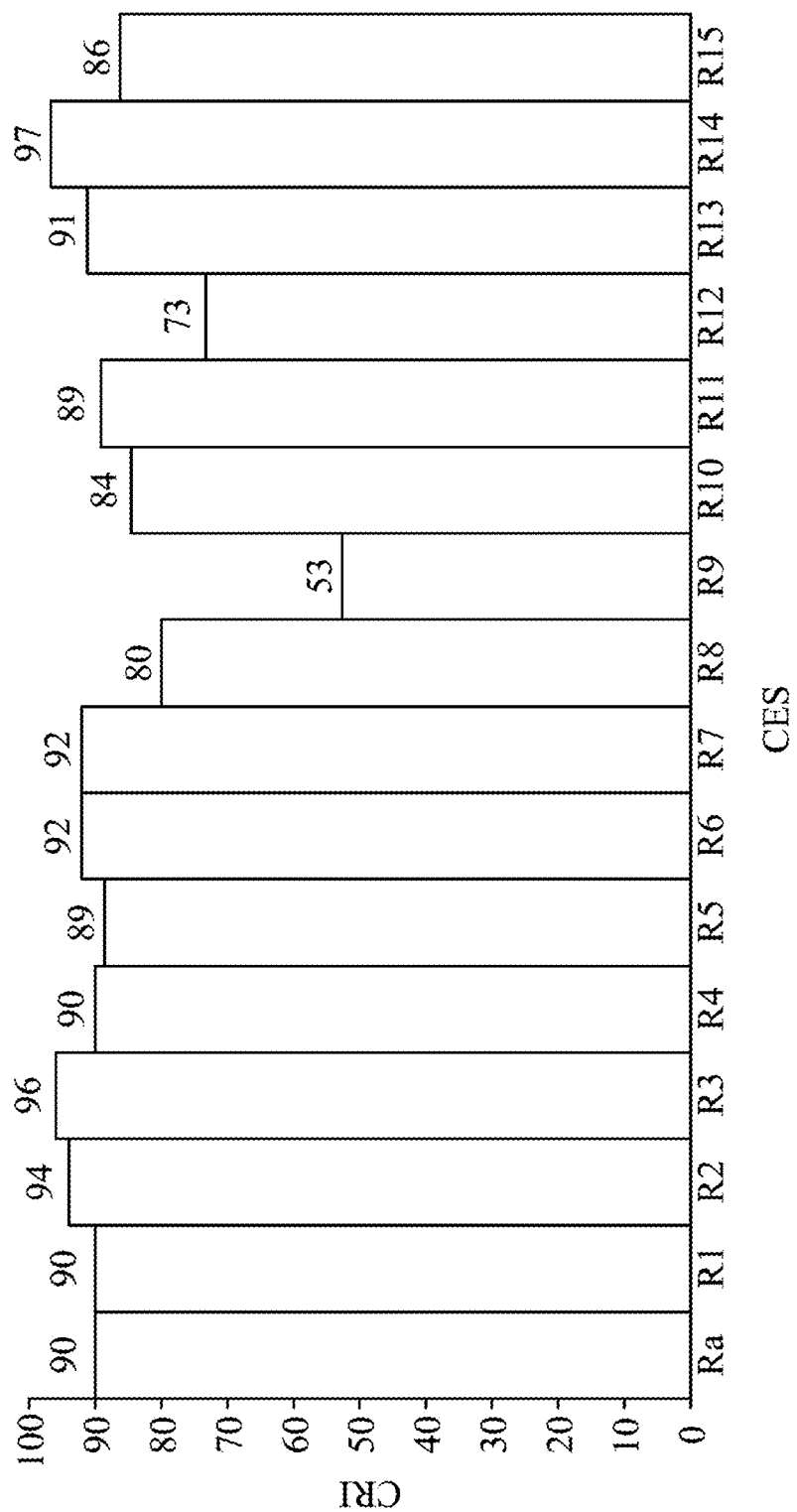
FIG. 1D is a bar chart of the CRIs of the colors of the white light source device according to another embodiment in FIG. 1A.

Besides, even if the general color rendering index (Ra) of the white light source device 50 can be achieved by changing the ratio of the red phosphors R to the green phosphors G, it is difficult to keep each of the CRIs greater than 90, hence fails to meet various lighting occasions with high light quality. For instance, FIG. 1D is a bar chart of the CRIs of the colors of the white light source device according to another embodiment in FIG. 1A. Please refer to FIG. 1D, after suitably adjusting the red phosphors R and the green phosphors G in the white light source device 50, although the general color rendering index (Ra) of the white light of the white light source device 50 in this embodiment can achieve 90, but a CRI of the strong red (R9) is only 53, and a CRI of the strong blue (R12) is only around 73, which cannot be improved.

Figure 2A:
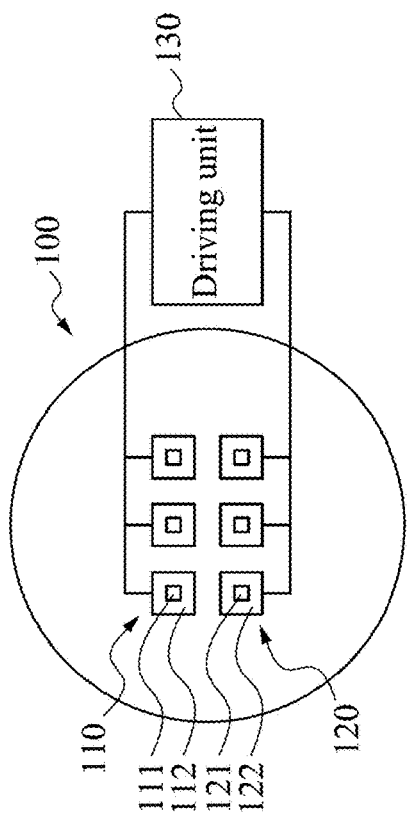
FIG. 2A is a diagram illustrating a white light source device according to an embodiment of the present disclosure.
Figure 2B:
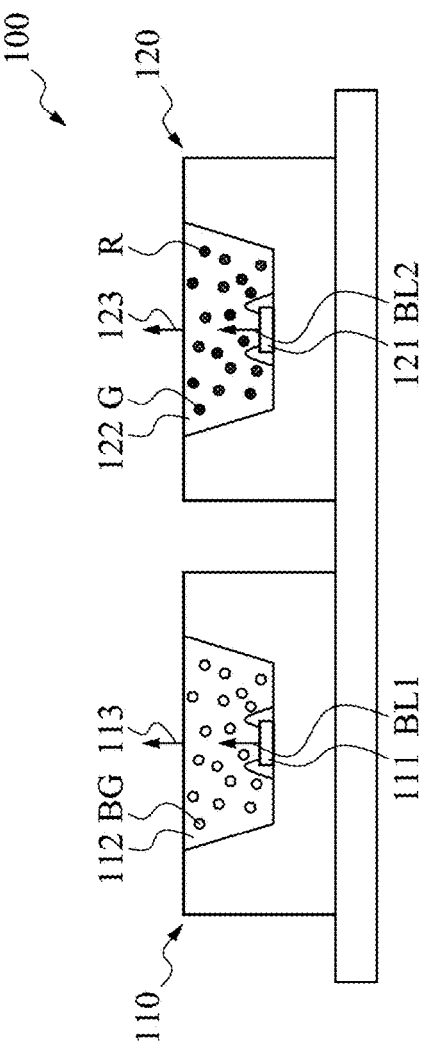
FIG. 2B is a cross-sectional view of the white light source device in FIG. 2A

FIG. 2A is a diagram illustrating a white light source device according to an embodiment of the present disclosure. FIG. 2B is a cross-sectional view of the white light source device in FIG. 2A. Please refer to FIG. 2A and FIG. 2B; in this embodiment, the white light source device 100 includes a first light-emitting unit 111 and at least a second light-emitting unit 121, a first wavelength conversion unit 112 and at least a second wavelength conversion unit 122. For instance, the first light-emitting unit 111 and the second light-emitting unit 121 are blue LEDs; however it is not a limitation of the present disclosure.

Specifically, as shown in FIG. 2A and FIG. 2B; in this embodiment, the first light-emitting unit 111 provides a first radiating light beam BL1 and the at least one second light-emitting unit 121 provides a second radiating light beam BL2, wherein the first radiating light beam BL1 and the second radiating light beam BL2 have substantially the same lighting wavelengths. For example, the first radiating light beam BL1 and the second radiating light beam BL2 are blue light, and a main wavelength range is between 450 nm and 462.5 nm, however, it is not a limitation of the present disclosure. In addition, as shown in FIG. 2A, in this embodiment, an amount of the at least one second light-emitting unit 121 is the same as that of the first light-emitting unit 111; that is, when there is one first light-emitting unit 111, the amount of the second light-emitting unit 121 is also one; however, it is not a limitation of the present disclosure. In other embodiments, the amount of the first light-emitting unit 111 can be different from that of the second light-emitting unit 121.

In this way, by using the aforementioned first light-emitting unit 111 and the second light-emitting unit 121 which have radiating light beams with substantially the same lighting wavelengths, a driving unit 130 of the white light source device 100 of the present disclosure can use the same driving voltage to drive the first light-emitting unit 111 and the second light-emitting unit 121, thereby simplifying the design of the control circuit, and avoiding using LED chips of two different colors to further avert corresponding color matching difficulty, yield, and cost issues in the manufacturing processes and for ease of mass production.

Specifically, as shown in FIG. 2B, in this embodiment, the first wavelength conversion unit 112 is located on the transmission path of the first radiating light beam BL1, and the first wavelength conversion unit 112 converts the first radiating light beam BL1 into a first light beam 113. For instance, in this embodiment, the first wavelength conversion unit 112, which is luminophors, formed by, for example, sintering, coating, or depositing, is combined with the first light-emitting unit 111 to form the first light-emitting element 110. More particularly, in this embodiment, the first wavelength conversion unit 112 includes blue-green phosphors BG, but no red phosphors R.

Figure 2C:
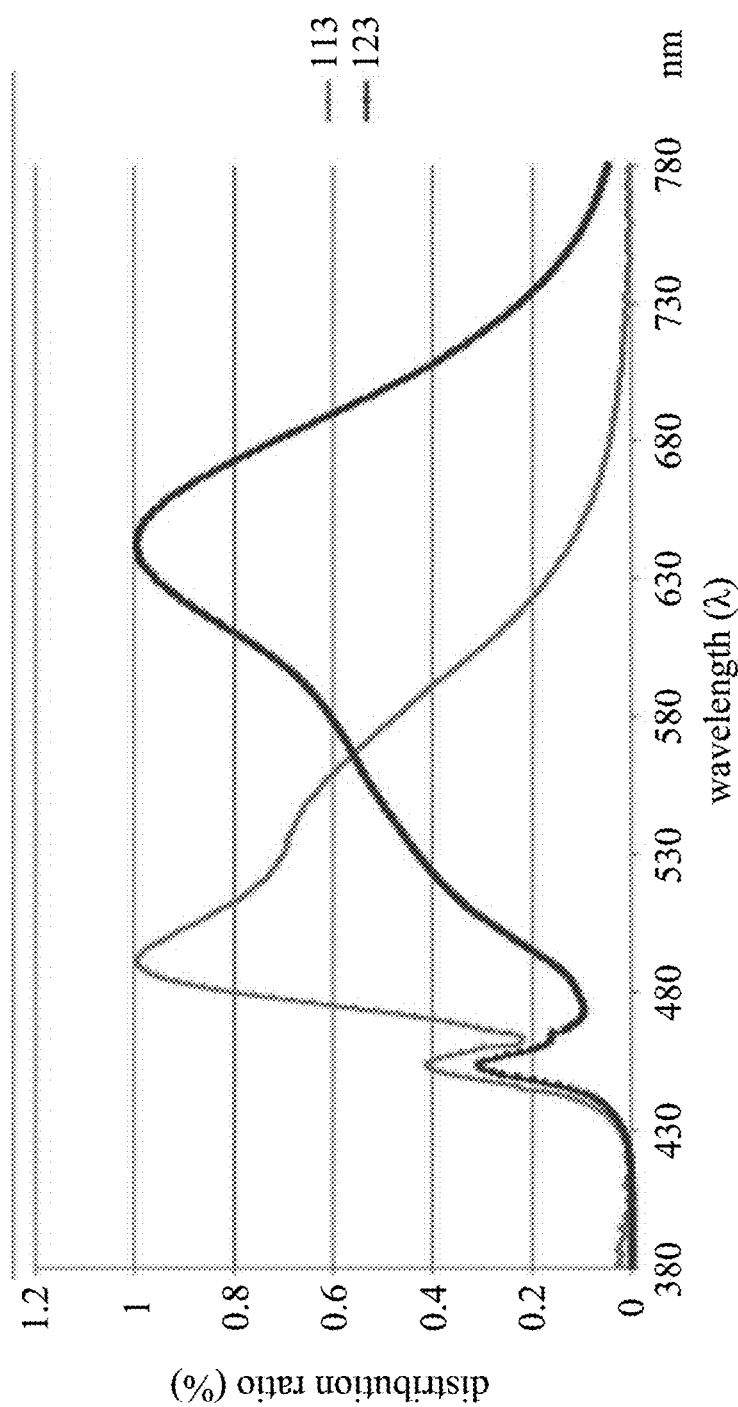
FIG. 2C is a diagram illustrating the band of the optical spectrum of the radiating light of the white light source device in FIG. 2A.

FIG. 2C is a diagram illustrating the band of the optical spectrum of the radiating light of the white light source device in FIG. 2A. Specifically, as shown in 2C, when the first light-emitting unit 111 is lit, the first radiating light beam BL1 excites the blue-green phosphors BG in the first wavelength conversion unit 112 for generating the first light beam 113. In this embodiment, the color of the first light beam 113 is blue green light, which includes a first emission-wavelength peak and a second emission-wavelength peak, a wavelength range of the first emission-wavelength peak is between 450 nm and 462.5 nm, and a wavelength range of the second emission-wavelength peak is between 462.5 nm and 500 nm.

On the other hand, please refer to FIG. 2B and FIG. 2C, in this embodiment, the at least one second wavelength conversion unit 122 is located on the transmission path of the second radiating light beam BL2, and the at least one second wavelength conversion unit 122 converts the second radiating light beam BL2 into at least one second light beam 123. For instance, in this embodiment, the second wavelength conversion unit 122 includes red phosphors R and green phosphors G, which are luminophors formed by sintering, coating, or depositing, for example, and to combine with the second light-emitting unit 121 to form the second light-emitting element 120.

Specifically, as shown in FIG. 2C; when the second light-emitting unit 121 is lit, the second radiating light beam BL2 excites the red phosphors R and green phosphors G in the second wavelength conversion unit 122 to generate the second light beam 123, wherein the color of the second light beam 123 is a yellow light which is mixed by the red light and the green light. And an emission spectrum of the second light beam 123 is different from an emission spectrum of the first light beam 113. For example, a wavelength range of the main light emitting band of the second light beam 123 is between 520 nm and 700 nm. In this way, the white light source device 100 can mixed the first light beam 113 and the second light beam 123 into a white light beam.

Therefore, the white light source device 100 can control and boost the band around the red light in the optical spectrum of the white light source device 100, and avoid the light of each color of phosphors absorbing each other, by placing the blue-green phosphors BG, the red phosphors R and the green phosphors G separately into different light emitting elements. In this way, the luminous efficiency of the white light source device 100 is promoted with good CRI performance and luminance requirements. Further explanations will be made below in conjunction with FIG. 2D-FIG. 2E.

Figure 2D:
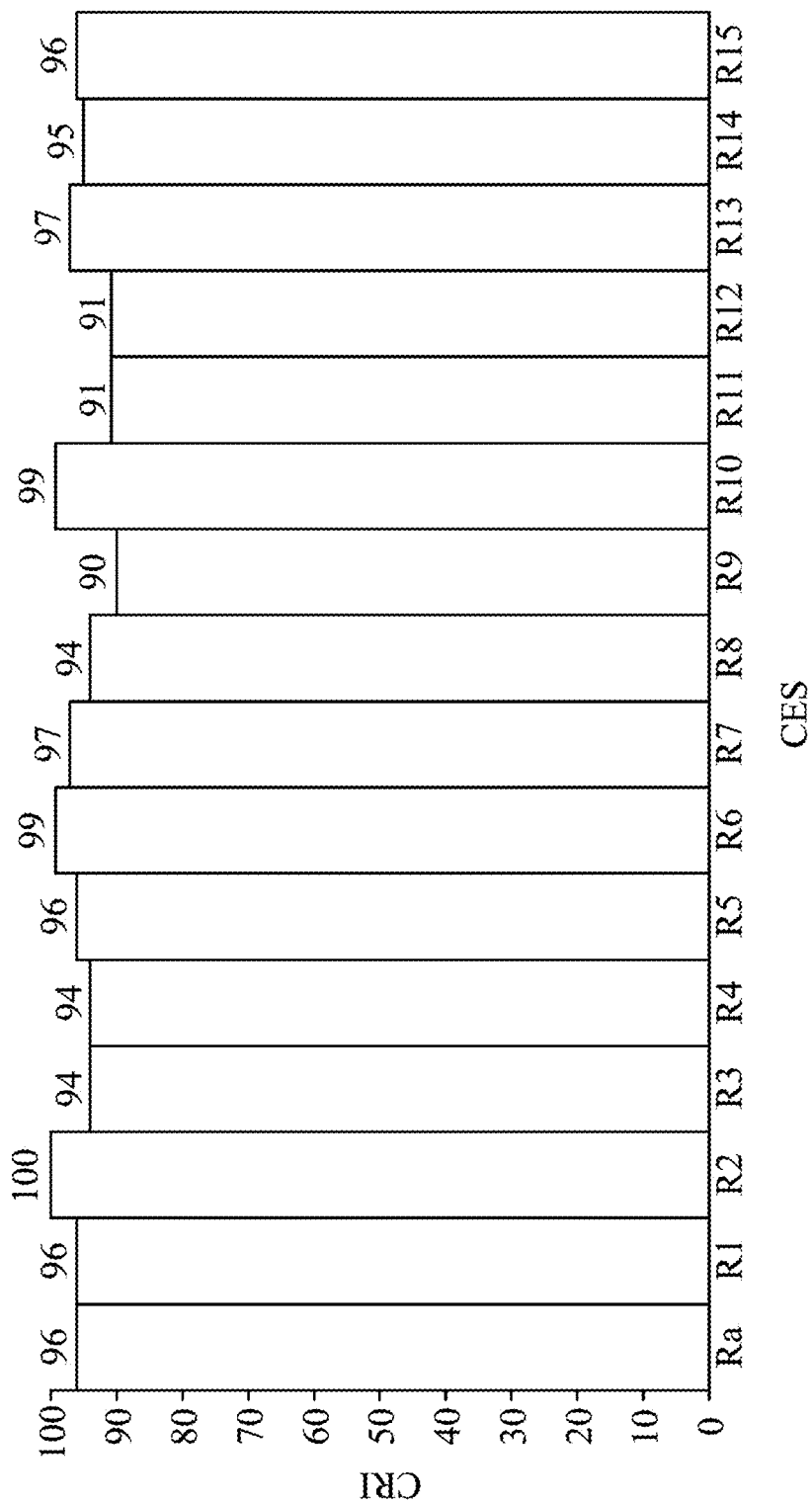
FIG. 2D is a bar chart of the color rendering indexes of the colors of the white light source device in FIG. 2A.

FIG. 2D is a bar chart of the color rendering indexes of the colors of the white light source device in FIG. 2A. Please refer to FIG. 2D; the manner of explaining the color rendering indexes of the white light source device is similar to FIG. 1C, hence descriptions of relative terms are omit here for the sake of brevity. Please refer to FIG. 2D; after adding the blue-green phosphors BG, the general color rendering index (Ra) of the white light source device 100 in this embodiment is 96, and the CRI of the strong red (R9) is promoted to 90, and the CRI of the strong blue (R12) is promoted to 91. That is, the white light source device 100 in this embodiment has a better CRI performance.

Figure 1E:
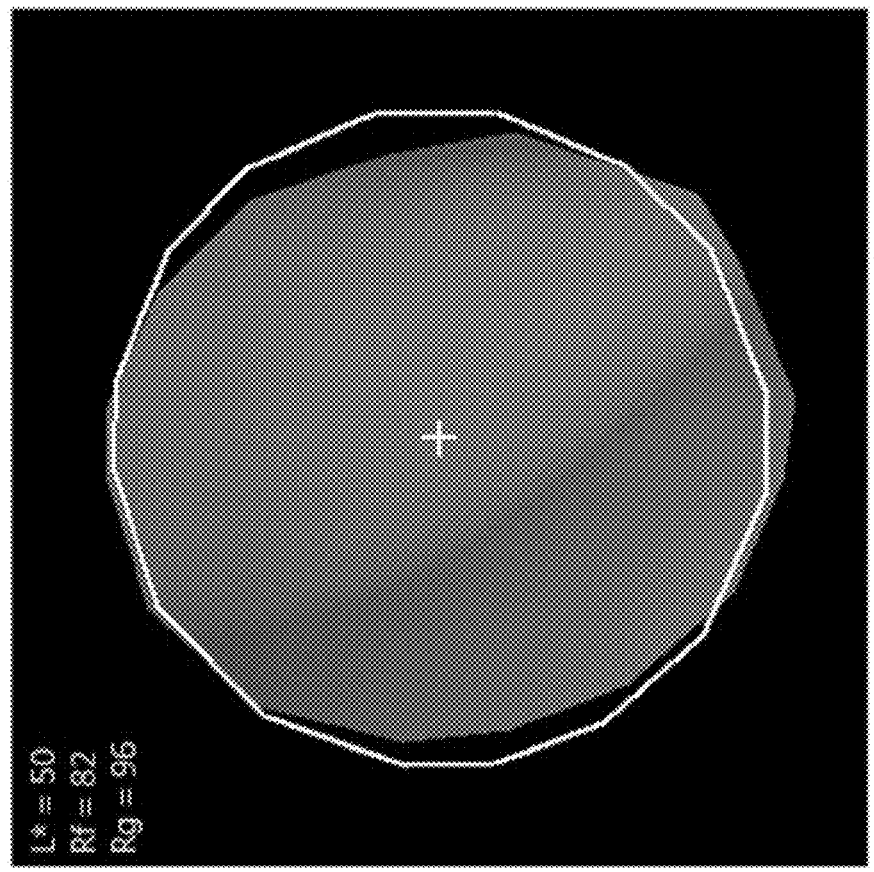
FIG. 1E is a color cast diagram of the white light source device in FIG. 1A.
Figure 2E:
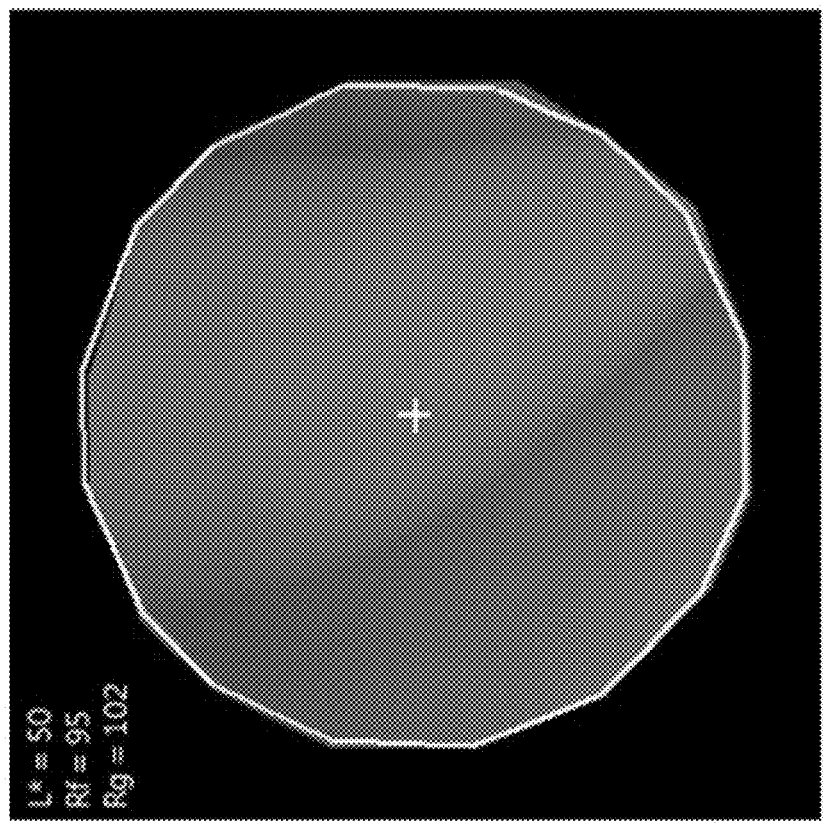
FIG. 2E is a color cast diagram of the white light source device in FIG. 2A.

Besides, FIG. 1E is a color cast diagram of the white light source device in FIG. 1A and FIG. 2E is a color cast diagram of the white light source device in FIG. 2A. Please refer to FIG. 1E and FIG. 2E; which further illustrate the CRI comparison between the white light source device 50 and the white light source device 100 by the method for Evaluating Light Source Color Rendition of IES TM-30-15.

For example, as shown in FIG. 1E; the white light of the white light source device 50 at the color temperature 2700K with a CRI 80, its fidelity index (Rf) is only 82, and the color gamut score (Rg) is only 96. Here, the fidelity index (Rf) refers to the degree of similarity between each CES under a testing light source and under an ideal reference light source (100 represents exactly the same, and 0 represents a large difference), and the color gamut score (Rg) refers to the changes in the saturation degree of each CES under a testing light source and under an ideal reference light source (100 represents the saturation degree is exactly the same, greater than 100 represents that the light source increases the color saturation, and less than 100 represents that the color saturation under the testing light source will be lower).

On the other hand, as shown in FIG. 2E; the white light of the white light source device 100 at the color temperature 2700K, its CRI of the strong red (R9) is promoted to 90, when the CRI is 96, its fidelity index (Rf) can achieve 95, and its color gamut score (Rg) can achieve 102. Particularly, as shown in Table 1, in the 99 CESes of the TM-30-15, the white light of the white light source device 100 can have all the CRIs of CES64 to CES78 greater than 90. Specifically, as shown in FIG. 2E; the curves of each color of the color atlas and curves of the color saturations of the white light of the white light source device 100 are close to that of each of the CES under a testing light source, therefore, the white light source device 100 has an excellent CRI performance.

TABLE 1

| CES | white light source device 50 | white light source device 100 |
| --- | --- | --- |
| CES64 | 80.9 | 98 |
| CES65 | 78.2 | 98.6 |
| CES66 | 79.5 | 99 |
| CES67 | 78.2 | 98.9 |
| CES68 | 80.7 | 96.3 |
| CES69 | 85.7 | 95.5 |
| CES70 | 78.2 | 95.4 |
| CES71 | 76.2 | 92.9 |
| CES72 | 91.1 | 97.5 |
| CES73 | 72.6 | 90.9 |
| CES74 | 89.5 | 91.8 |

TABLE 1-continued

| CES | white light source device 50 | white light source device 100 |
|---|---|---|
| CES75 | 79.2 | 92.8 |
| CES76 | 81 | 94 |
| CES77 | 82.3 | 94.2 |
| CES78 | 79.3 | 90.1 |

On the other hand, since the white light source device 100 places the blue-green phosphors BG, the red phosphors R, and the green phosphors G separately into different light emitting elements, to avoid the light of each color of phosphors absorbing each other, and hence achieves a better luminance and luminous efficiency.

For example, comparing another embodiment in which the blue-green phosphors BG and the red phosphors R do not be placed separately, that is, the wavelength conversion unit of the white light source device has three types of phosphors at the same time, the blue-green phosphors, the red phosphors and the green phosphors are packed into the same colloid, and the luminance and luminous efficiency of which will be decreased due to the light of each color of phosphors absorbing each other.

Particularly, when the driving voltage is 2.78V, and the driving current is 0.065 mA, the luminance of the white light source device having the wavelength conversion unit of three different colors of phosphors is 21.6 lm, and the luminous efficiency is 120 lm/w. However, in the same case, the white light source device 100 in this embodiment can have a luminance of 22.79 lm, and a luminous efficiency of 126 lm/w. In other words, comparing to the white light source device with a wavelength conversion unit having three types of phosphors at the same time, the white light source device 100 in the embodiment can promotes 5% of luminous efficiency and keeps excellent CRI performance and luminance requirements. Please note the numerical ranges described above are for illustrative purposes only and are not limitations of the present disclosure.

FIG. 3A is a diagram illustrating a white light source device according to another embodiment of the present disclosure. FIG. 3B is a cross-sectional view of the white light source device in FIG. 3A. Please refer to FIG. 3A and FIG. 3B; the white light source device 200 in FIG. 3A and FIG. 3B are similar to the white light source device 100 in FIG. 2A and FIG. 2B, the differences between FIG. 3A, FIG. 3B and FIG. 2A, FIG. 2B are described below. As shown in FIG. 3A and FIG. 3B, in this embodiment, an amount of the at least one second wavelength conversion units 222a, 222b and an amount of the at least one second light-emitting unit 121 are greater than one, and part of the second wavelength conversion units 222a includes green phosphors G, and another part of the second wavelength conversion units 222b includes red phosphors R. In addition, an amount of the at least one second light-emitting units 121 is correspondingly proportional to an amount of the first light-emitting unit 111, for example, when the amount of the first light-emitting unit 111 is one, an amount of the second light-emitting units 121 is two, however, it is not meant to be a limitation of the present disclosure. In other embodiments, people have ordinary skills in this field can decide the ratio of the first light-emitting units 111 to the second light-emitting units 121 of the white light source device according to the actual requirements for making the required white light. On the other hand, the second wavelength conversion units 222a, 222b separately combine with the corresponding second light-emitting units 121 for forming the second light-emitting elements 220a, 220b.

Figure 3C:
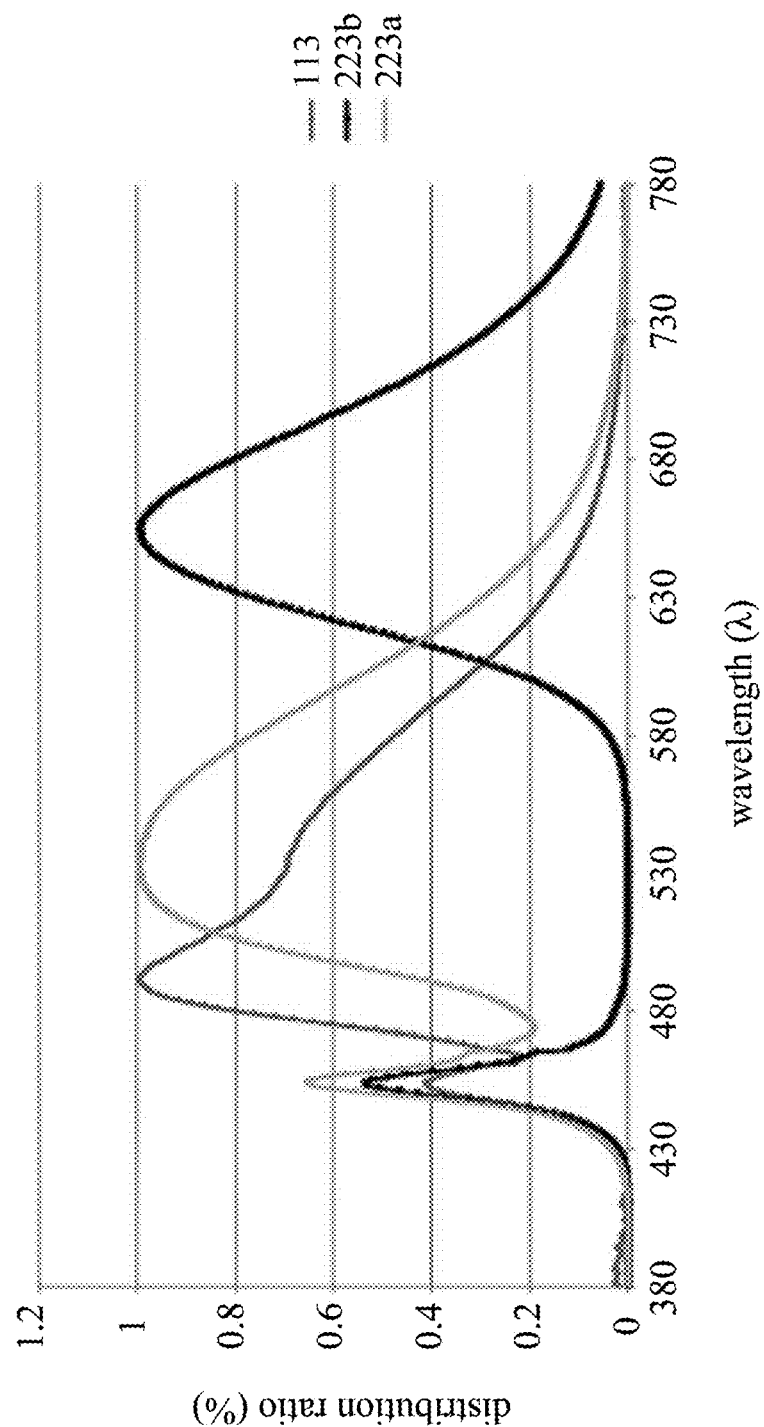
FIG. 3C is a diagram illustrating an optic spectrum of the white light source device in FIG. 3A.

FIG. 3C is a diagram illustrating an optic spectrum of the white light source device in FIG. 3A. Particularly, as shown in FIG. 3B and FIG. 3C; when the second light-emitting unit 121 is lit, the second radiating light beam BL2 will separately excite the green phosphors G in the second wavelength conversion unit 222a and the red phosphors R in the second wavelength conversion unit 222b, to generate the second light beams 223a and 223b, wherein the second light beam 223a is green light and the 223b is red light. For example, as shown in FIG. 3C, a main light emitting band of the wavelength range of the second light beam 223a is between 500 nm and 600 nm, and a main light emitting band of the wavelength range of the second light beam 223b is between 630 nm and 700 nm. Thus the second light beams 223a and 223b emitted by the second light-emitting elements 220a and 220b can be mixed with the first light beam 113 of the first light-emitting element 110 to form a white light beam.

In other words, in this embodiment, the white light source device 200 can control and boost the band around the red light in the optical spectrum of the white light source device 200, and avoid the light of each color of phosphors absorbing each other, and to achieve a better luminance and luminous efficiency by placing the blue-green phosphors BG, the red phosphors R, and the green phosphors G separately into different light emitting elements.

Further explanations will be made below in conjunction with FIG. 3D-FIG. 3E.

Figure 3D:
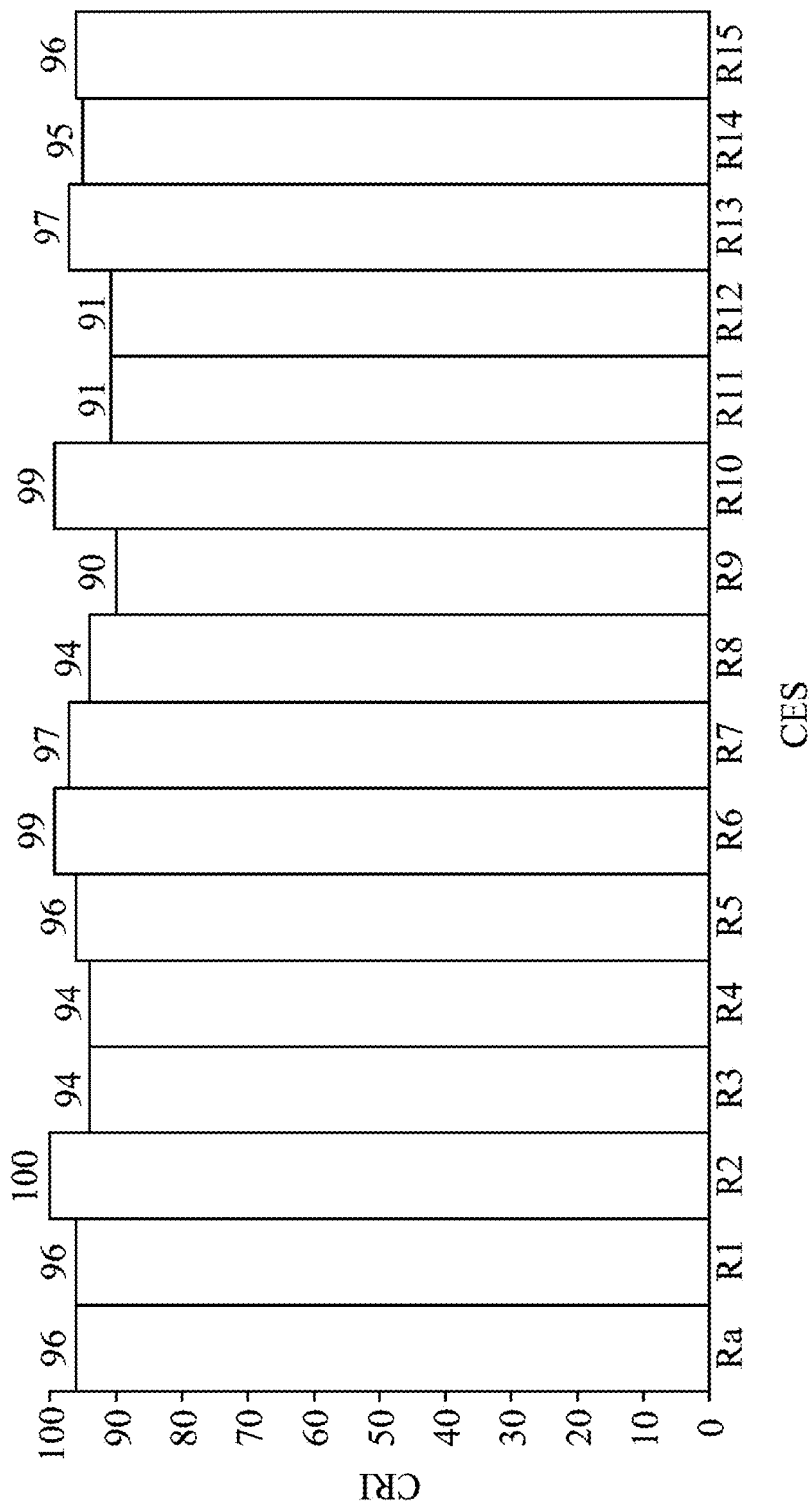
FIG. 3D is a bar chart of the color rendering indexes of the colors of the white light source device in FIG. 3A.

FIG. 3D is a bar chart of the color rendering indexes of the colors of the white light source device in FIG. 3A. Please refer to FIG. 3D; since the manner of explaining the color rendering indexes of the white light source device is similar to FIG. 1C, descriptions of relative terns are omit here for the sake of brevity. As shown in FIG. 3D; after adding the blue-green phosphors BG, the general color rendering index (Ra) of the white light source device 200 achieves 96, and the CRI of the strong red (R9) is promoted to 90, and the CRI of the strong blue (R12) is promoted to 91. That is, the white light source device 200 in this embodiment has a better CRI performance.

Figure 3E:
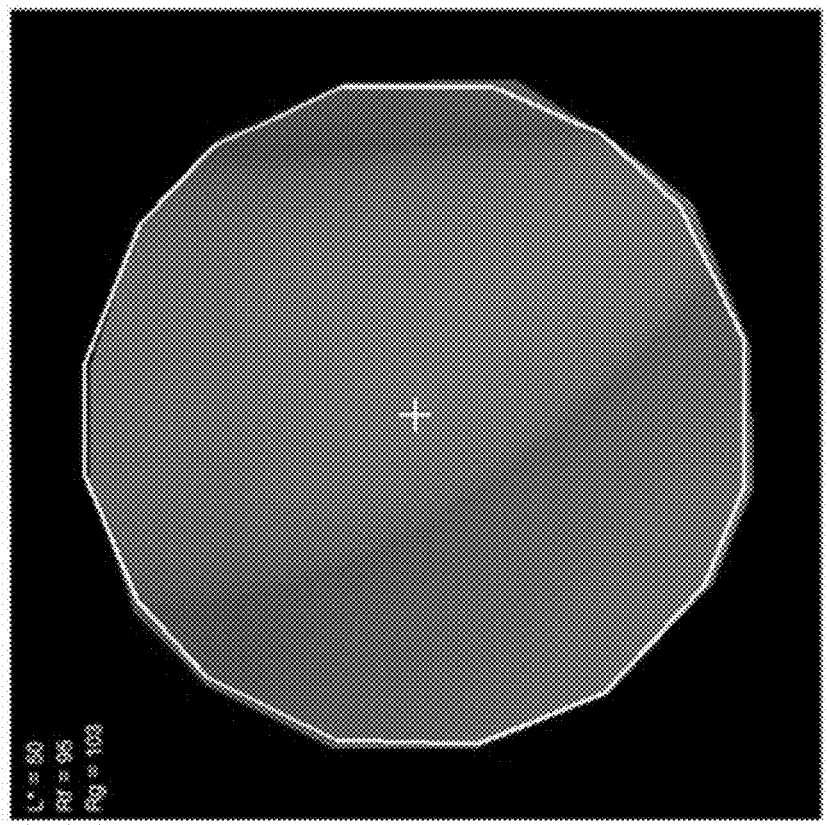
FIG. 3E is a color cast diagram of the white light source device in FIG. 3A.

FIG. 3E is a color cast diagram of the white light source device in FIG. 3A. Please refer to FIG. 3E; since the manner of explaining the color rendering indexes of the white light source device is similar to FIG. 2E, descriptions of relative terns are omit here for the sake of brevity. Specifically, as shown in FIG. 3E, at the color temperature 2700K, the white light of the white light source device 200 has a CRI of the strong red (R9) is promoted to 90, and a color rendering performance achieve 96, its fidelity index (Rf) can reach 95, and the gamut index (Rg) can reach 103. Furthermore, since the color rending ability of the white light in FIG. 3E is similar to that in FIG. 2E, the white light of the white light source device 200 can have all CRIs of CES64 to CES78 greater than 90. Specifically, as shown in FIG. 3E; the curves of each color of the color atlas and of the color saturations of the white light of the white light source device 200 are close to that of each of the CES under a testing light source, therefore, the white light source device 200 has an excellent CRI performance.

On the other hand, in the case of using the same driving voltage and the same driving current, comparing to the white light source device, which houses a wavelength conversion unit with three colors of phosphors at the same time, and the aforementioned white light source device 100, the white light source device 200 in this embodiment has a higher luminance a better luminous efficiency. For example, when the driving voltage is 2.78V, and the driving current is 0.065 mA, the white light source device 200 in this embodiment under the same circumstance can reach a luminance of 23.91 lm, and a luminous efficiency of 132 lm/w. That is, comparing to the aforementioned white light source device 100, the white light source device 200 in this embodiment has a better luminous efficiency. Comparing to the white light source device, which houses a wavelength conversion unit with three colors of phosphors at the same time, the luminous efficiency of the white light source device 200 can be enhance about 10%. Please note the numerical ranges described above are for illustrative purposes only and are not intended to limit the present disclosure.

The white light source device 200 can control and boost the band around the red light in the optical spectrum of the white light source device 200, and avoid the light of each color of phosphors absorbing each other, hence achieves a better luminance and luminous efficiency, by placing the blue-green phosphors BG, the red phosphors R, and the green phosphors G separately into different light emitting elements. In this way, the white light source device 200 can increase its luminous efficiency, and keep the good CRI performance and luminous requirements, while having other effects and advantages of the white light source device 100, the similar effects and advantages will not repeat them here for the sake of the brevity.

In conclusion, by placing the blue-green phosphors, the red phosphors, and the green phosphors separately into different light emitting elements, the white light source device of the present disclosure can control and boost the band around the red light in the optical spectrum of the white light source, and avoid the light of each color of phosphors absorbing each other, hence achieves a better luminous efficiency, for keeping the luminance requirements and the CRI performance.

In addition, by using the first light-emitting unit and the second light-emitting unit which have substantially the same lighting wavelengths, the white light source device in the present disclosure can use the first light-emitting unit and the second light-emitting unit which can be driven by the same driving voltage, the design of the control circuit hence is simplified, and to further avert corresponding color matching difficulty, yield, and cost issues in the manufacturing processes and ease the mass production.

Although the present disclosure has been described in considerable detail with reference to certain embodiments thereof, other embodiments are possible. Therefore, the spirit and scope of the appended claims should not be limited to the description of the embodiments contained herein.

What is claimed is:

1. A white light source device, comprising:
   a first light-emitting element having a first wavelength conversion unit and a first light-emitting unit in the first wavelength conversion unit, wherein the first light-emitting element emits a first light beam; and
   at least a second light-emitting element, wherein each of the second light-emitting elements has a second wavelength conversion unit and a second light-emitting unit in the second wavelength conversion unit, a top surface of the first wavelength conversion unit and a top surface of the second wavelength conversion unit are free from coverage of a molding structure, each of the second light-emitting elements emits a second light beam, an emission spectrum of the second light beam is different from an emission spectrum of the first light beam, and each of the first light-emitting element and the second light-emitting element are spaced apart from each other;
   wherein the first light beam has a first emission-wavelength peak and a second emission-wavelength peak, a wavelength range of the first emission-wavelength peak is between 450 nm and 462.5 nm, and a wavelength range of the second emission-wavelength peak is between 462.5 nm and 500 nm. The first light beam and the second light beam are mixed into a white light beam.

2. The white light source device of claim 1, wherein the first light-emitting unit and the second light-emitting unit are blue LEDs.

3. The white light source device of claim 1, wherein the first wavelength conversion unit comprises a single type of phosphors.

4. The white light source device of claim 3, wherein the first wavelength conversion unit comprises blue-green phosphors.

5. The white light source device of claim 3, wherein the second wavelength conversion unit comprises two types of phosphors.

6. The white light source device of claim 5, wherein the second wavelength conversion unit comprises red phosphors and green phosphors.

7. The white light source device of claim 1, wherein an amount of the at least one second light-emitting elements is more than one, wherein part of the second wavelength conversion units comprises green phosphors and another part of the second wavelength conversion units comprises red phosphors.

8. A white light source device, comprising:
   a first light-emitting element having a first wavelength conversion unit and a first light-emitting unit in the first wavelength conversion unit, wherein the first light-emitting element emits a first light beam; and
   at least a second light-emitting element, wherein each of the second light-emitting elements has a second wavelength conversion unit and a second light-emitting unit in the second wavelength conversion unit, a top surface of the first wavelength conversion unit and a top surface of the second wavelength conversion unit are free from coverage of a molding structure, the second light-emitting element emits a second light beam, an emission spectrum of the second light beam is different from an emission spectrum of the first light beam, and each of the first light-emitting element and the second light-emitting element are spaced apart from each other;
   wherein the first light beam and the second light beam are mixed into a white light beam, and a color fidelity index of the white light beam is greater than 90.

9. The white light source device of claim 8, wherein the first light-emitting unit and the second light-emitting unit are blue LEDs.

10. The white light source device of claim 8, wherein the first wavelength conversion unit comprises a single type of phosphors.

11. The white light source device of claim 10, wherein the first wavelength conversion unit comprises blue-green phosphors.

12. The white light source device of claim 10, wherein the second wavelength conversion unit comprises two types of phosphors.

13. The white light source device of claim 12, wherein the second wavelength conversion unit comprises red phosphors and green phosphors.

14. The white light source device of claim 8, wherein an amount of the at least one second light-emitting elements is more than one, wherein part of the second wavelength conversion units comprises green phosphors and another part of the second wavelength conversion units comprises red phosphors.

15. A white light source device, comprising:
- a first light-emitting element having a first wavelength conversion unit and a first light-emitting unit in the first wavelength conversion unit, wherein the first light-emitting element emits a first light beam; and
- at least a second light-emitting element, wherein each of the second light-emitting elements has a second wavelength conversion unit and a second light-emitting unit in the second wavelength conversion unit, a top surface of the first wavelength conversion unit and a top surface of the second wavelength conversion unit are free from coverage of a molding structure, the second light-emitting element emits a second light beam, an emission spectrum of the second light beam is different from an emission spectrum of the first light beam, and each of the first light-emitting element and the second light-emitting element are spaced apart from each other;

wherein the first light beam and the second light beam are mixed into a white light beam, and color rendering indexes of Color Evaluation Samples (CES) 64 - CES78 of the white light beam are greater than 90.

16. The white light source device of claim 15, wherein the first light-emitting unit and the second light-emitting unit are blue LEDs.

17. The white light source device of claim 15, wherein the first wavelength conversion unit comprises a single type of phosphors.

18. The white light source device of claim 17, wherein the first wavelength conversion unit comprises blue-green phosphors.

19. The white light source device of claim 17, wherein the second wavelength conversion unit comprises two types of phosphors.

20. The white light source device of claim 19, wherein the second wavelength conversion unit comprises red phosphors and green phosphors.

21. The white light source device of claim 15, wherein an amount of the at least one second light-emitting elements is more than one, wherein part of the second wavelength conversion units comprises green phosphors and another part of the second wavelength conversion units comprises red phosphors.

* * * * *